United States Patent

Hasegawa et al.

[11] Patent Number: 5,271,788
[45] Date of Patent: Dec. 21, 1993

[54] PLASMA PROCESSING APPARATUS

[75] Inventors: Makoto Hasegawa, Kawasaki; Takaya Matsushita, Yokohama; Keiji Horioka, Kawasaki; Isahiro Hasegawa, Zushi; Toshihisa Nozawa, Kobe; Yoshio Ishikawa, Tokyo; Masahito Hiratsuka, Kofu; Satoshi Kaneko, Kumamoto, all of Japan

[73] Assignees: Tokyo Electron Limited, Tokyo; Kabushiki Kaisha Toshiba, Kawasaki, both of Japan

[21] Appl. No.: 917,361

[22] Filed: Jul. 23, 1992

[30] Foreign Application Priority Data

| Jul. 23, 1991 | [JP] | Japan | 3-207407 |
| Jul. 23, 1991 | [JP] | Japan | 3-207408 |
| Jul. 23, 1991 | [JP] | Japan | 3-207409 |
| Jul. 24, 1991 | [JP] | Japan | 3-208444 |
| Jul. 24, 1991 | [JP] | Japan | 3-208445 |

[51] Int. Cl.$^5$ .............................. C23F 1/02
[52] U.S. Cl. .................. 156/345; 204/298.31; 204/298.34; 204/298.37
[58] Field of Search ............ 156/345; 204/298.15, 204/298.31, 298.33, 298.37, 298.38, 192.37, 298.34

[56] References Cited

U.S. PATENT DOCUMENTS

| 4,552,369 | 11/1985 | Garrett | 204/298.37 |
| 4,572,759 | 2/1986 | Benzing | 204/298.37 X |
| 4,793,975 | 12/1988 | Drage | 204/298.15 X |
| 4,871,420 | 10/1989 | Alexander, Jr. et al. | 204/298.31 X |
| 4,878,995 | 11/1989 | Arikado et al. | 204/298.31 X |
| 4,891,087 | 1/1990 | Davis et al. | 156/345 |
| 4,906,347 | 3/1990 | Tomita et al. | 204/298 |
| 4,943,361 | 7/1990 | Kakehi et al. | 204/298.37 X |
| 4,968,374 | 11/1990 | Tsukada et al. | 204/298.31 X |
| 5,147,497 | 9/1992 | Nozawa et al. | 204/298.32 X |

FOREIGN PATENT DOCUMENTS

| 0202904 | 11/1986 | European Pat. Off. . |
| 51-124379 | 10/1976 | Japan . |
| 59-27213 | 7/1984 | Japan . |
| 59-140375 | 8/1984 | Japan . |
| 60-120520 | 6/1985 | Japan . |
| 61-278149 | 12/1986 | Japan . |
| 62-16167 | 1/1987 | Japan . |
| 62-21644 | 1/1987 | Japan . |
| 62-150735 | 7/1987 | Japan . |
| 64-7156 | 2/1989 | Japan . |

OTHER PUBLICATIONS

IBM Technical Disclosure Bulletin, vol. 30, No. 2, Jul. 1987, pp. 543-544, "Quartz Dielectric Cathode Ring Improves Etch Rate".
Patent Abstracts of Japan, vol. 13, No. 18, (E-704), Jan. 17, 1989, & JP-A-63 224 232, Sep. 19, 1988, Kakehi Yutaka, et al., "Plasma Treatment and Device Therefor".

Primary Examiner—Nam Nguyen
Attorney, Agent, or Firm—Oblon, Spivak, McClelland, Maier & Neustadt

[57] ABSTRACT

A magnetron plasma etching apparatus comprises a suscepter serving as an electrode on which a silicon wafer is mounted. A carbon ring having an outer diameter larger than the diameter of the wafer and an electrical resistance lower than that of the wafer, is arranged around the suscepter. The carbon ring is electrically connected to the suscepter. The carbon ring improves uniformity of etching of the wafer.

19 Claims, 15 Drawing Sheets

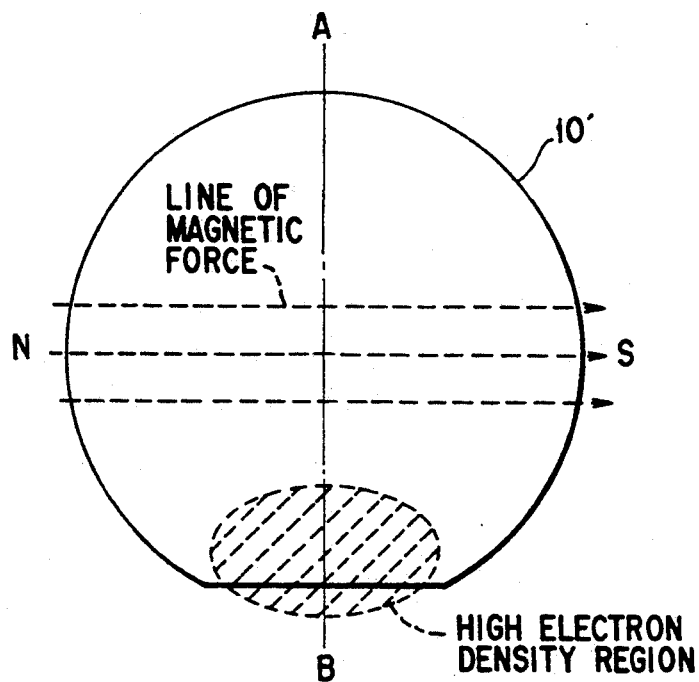
F I G. 4
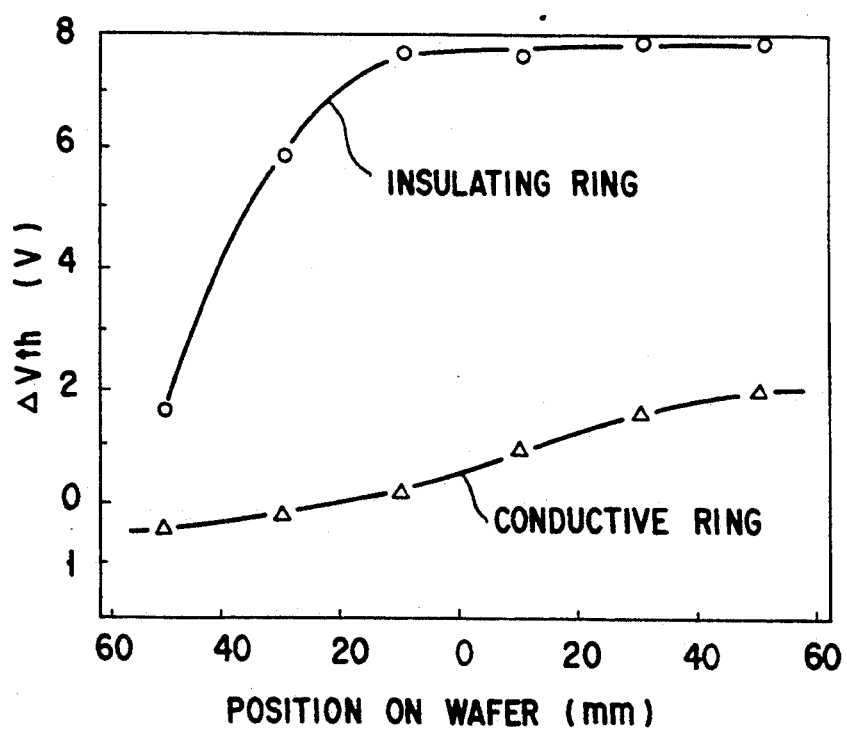
F I G. 5

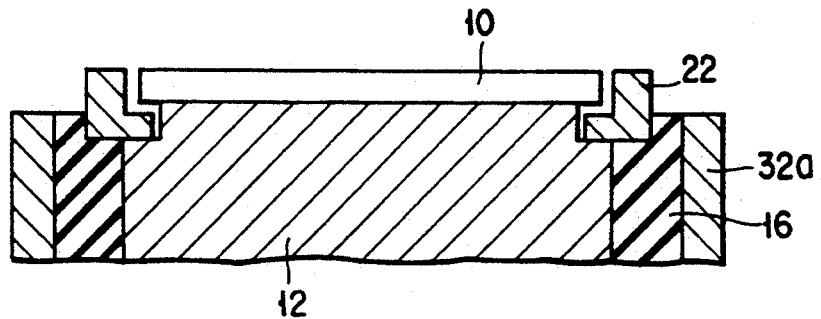
F I G. 6A
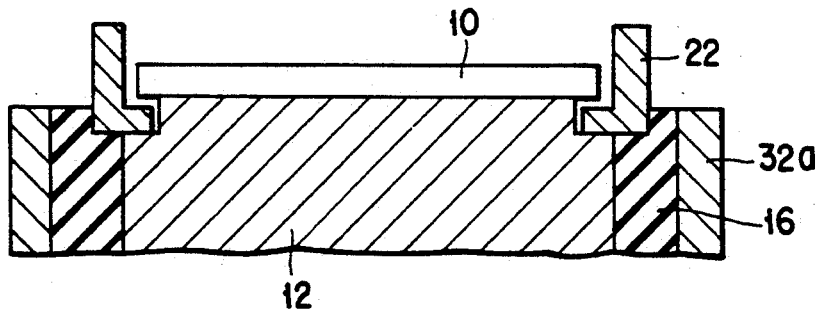
F I G. 6B

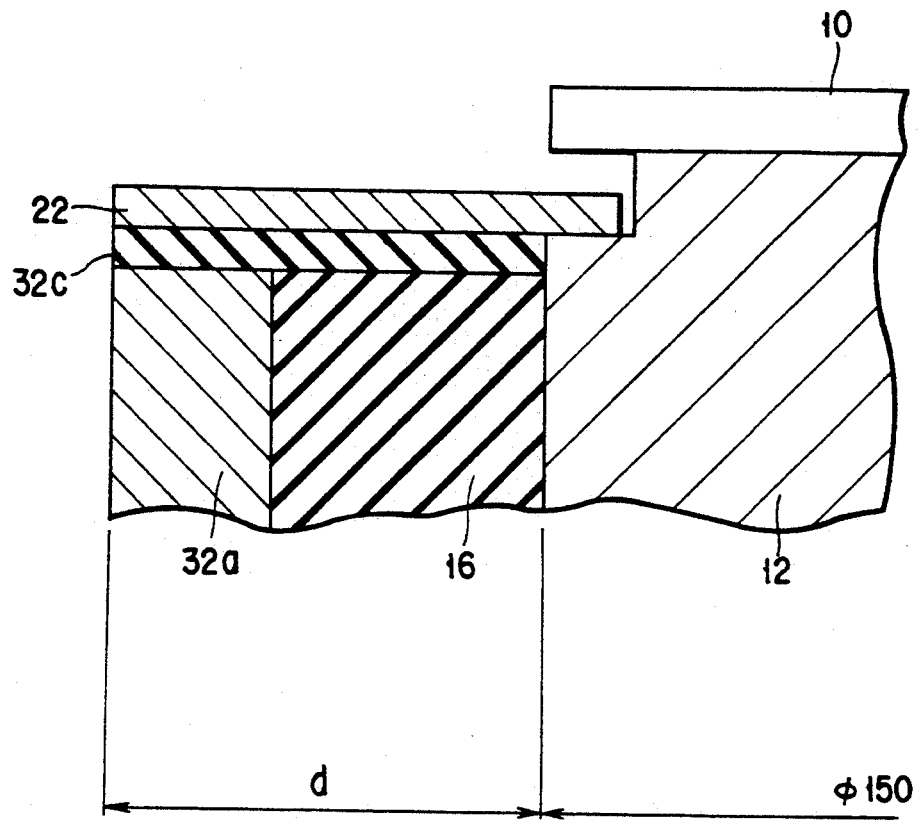
F I G. 8

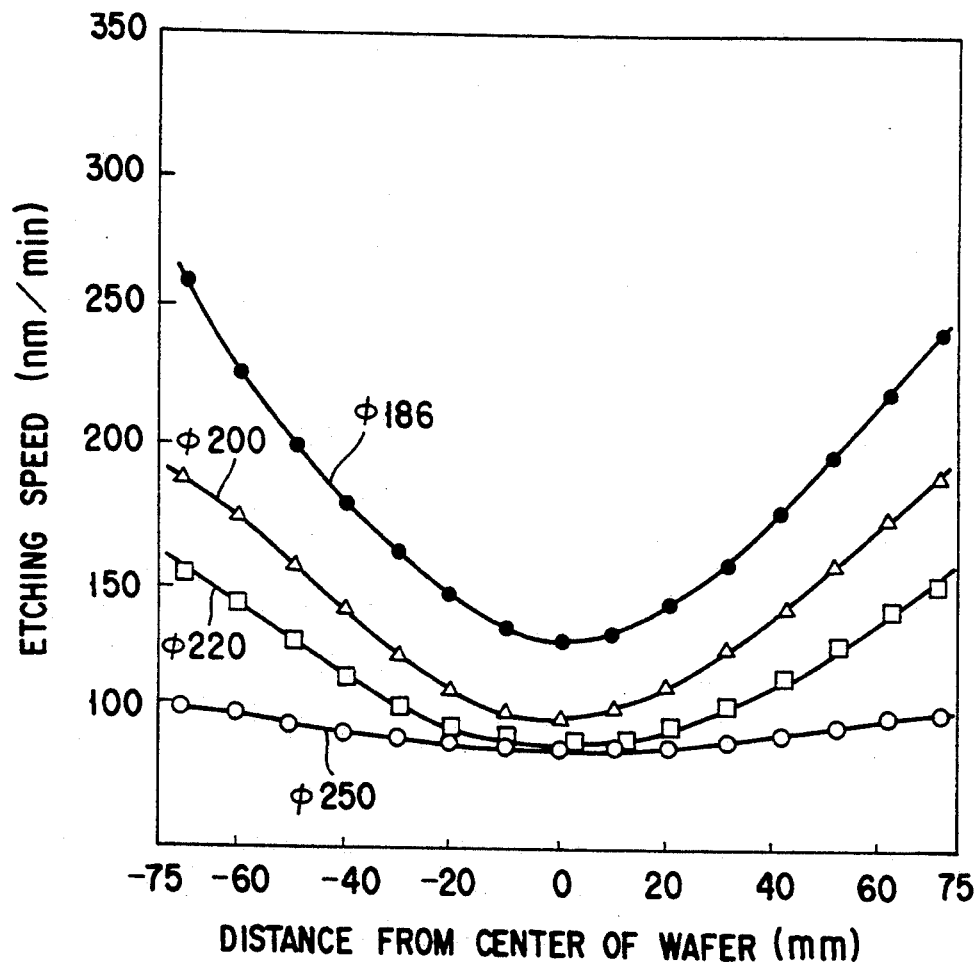
F I G. 10

5,271,788

PLASMA PROCESSING APPARATUS

BACKGROUND OF THE INVENTION

1. Field of the Invention

The present invention relates to a plasma processing apparatus for use in manufacture of semiconductor devices and, more particularly, to a magnetron plasma etching apparatus.

2. Description of the Related Art

Conventionally, a dry etching apparatus, a thin-film forming apparatus, and the like for use in manufacture of semiconductor elements are known as a magnetron plasma processing apparatus. In this apparatus, plasma is generated in a process chamber of the apparatus to perform a desired operation, such as etching and thin-film formation, by the action of ions, radicals, electrons, etc. contained in the plasma.

The magnetron plasma processing apparatus will now be described, taking a magnetron plasma etching apparatus shown in FIG. 1 by way of example.

As shown in FIG. 1, a process chamber 40 is so formed that it can be evacuated and can receive an etching gas. The process chamber 40 includes a plate-like mounting electrode 42 on which a wafer 40 as an object to be processed is mounted, and a plate-like upper electrode 46 arranged in parallel to the mounting electrode 42. Both these electrodes 42 and 46 are formed of conductive material. For example, the upper electrode 46 is grounded, and the mounting electrode 42 is connected to an RF power supply 44 for generating RF power of, e.g., 380 KHz or 13.56 MHz. In this structure, plasma can be generated over the wafer 10 between the electrodes 42 and 46 by a cathode coupling method. Electrons, neutrons, or the like included in the plasma react on or physically act on silicon which forms the wafer 10, thereby etching the wafer 10.

In the magnetron plasma etching apparatus shown in FIG. 1, a magnetic field having a component parallel to the electrodes 42 and 46 is generated between them, as indicated by broken lines, by rotating two permanent magnets 38 supported by a yoke 38b using a rotating shaft 38a. This is because an electric field generated between the electrodes 42 and 46, and the component of the magnetic field perpendicular to the electric field act on the Fleming's rule to cause the cycloid movement of electrons in directions perpendicular to the electric field and the component of the magnetic field to increase the frequency of a collision between the electrons and gas components. Consequently, the amount of plasma generation can be increased, and the etching speed can be increased.

It is required that the etching speed be kept constant on the entire surface of the silicon wafer 10. However, if the conventional plasma etching apparatus is used, wafer etching cannot be uniformed for the following reasons.

(1) The magnetic field generated by the permanent magnets 38 is virtually parallel to the vicinity of the central part of the surface of the wafer 10, and the component of the magnetic field, which is perpendicular to the electric field, is large. In contrast, since the magnetic field generated near the periphery of the wafer 10 is not parallel to the surface of the wafer 10, the perpendicular component of the magnetic field is small. Therefore, the cycloid movement of electrons is hard to occur.

(2) Since the electrons are moved in a direction perpendicular to the magnetic field by the cycloid movement, the density of the electrons is very increased on part of the periphery of the wafer 10, which damages the wafer 10. The ions in the plasma collide with the surface of the wafer 10 by the action of an ion sheath formed between the electrodes 42 and 46. Some of the ions colliding with the surface of the wafer 10, are implanted into the wafer and damage it. When the density of the electrons in the plasma is high, the ions implanted into the wafer 10 are increased in number, with the result that the wafer is greatly damaged. Since the magnetic field is rotated in the magnetron plasma etching apparatus, it is all the periphery of the wafer 10 that is damaged by the ions.

(3) The ion density of etching gas (e.g., Cl) is increased in a region above near the periphery of the wafer 10 more than in a region above near the central part thereof. One reason for this is that the flow (exhaust) of gas generated by etching reaction is slow above near the central part of the wafer 10 and fast above near the periphery thereof.

The above problems are not peculiar to the magnetron plasma etching apparatus but common to a magnetron plasma sputtering apparatus, a plasma CVD apparatus, and the like.

SUMMARY OF THE INVENTION

It is accordingly an object of the present invention is to provide a plasma treating apparatus capable of high uniform etching of a silicon wafer.

According to a first aspect of the present invention, there is provided a magnetron plasma processing apparatus comprising:

a process chamber allowed to be set in a highly reduced pressure atmosphere;

a first electrode exposed into the process chamber and having a mounting surface on which a substrate to be processed is mounted;

a second electrode exposed into the process chamber and having a major surface opposite to the mounting surface of the first electrode, the major surface including a first surface portion opposite and parallel to the mounting surface and second surface portions on both sides of the first surface portion and almost perpendicular to the mounting surface;

power supply means for applying a voltage to the first and second electrodes to generate an electric field therebetween; and magnetic field generation means arranged behind the first surface portion of the second electrode, for generating a magnetic field between the first and second electrodes so as to cross the electric field substantially at right angles.

According to a second aspect of the present invention, there is provided a plasma etching apparatus comprising:

a process chamber allowed to be set in a highly reduced pressure atmosphere;

introduction means for introducing etching gas into the process chamber;

a first electrode exposed into the process chamber and having a mounting surface on which a substrate to be processed is mounted;

a second electrode exposed into the process chamber and having a major surface opposite to the mounting surface of the first electrode;

power supply means for applying a voltage to the first and second electrodes to generate an electric field therebetween; and a ring surrounding the mounting surface of the first electrode and having an outline larger than that of the substrate to be processed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a plan view showing a wafer 10' on which an E²PROM is formed and a high density region of electrons;

FIG. 5 is a graph showing results of E²PROM evaluation using the apparatus of the first embodiment;

FIGS. 6A and 6B are cross-sectional views showing modifications to a conductive ring of the apparatus of the first embodiment;

FIG. 8 is an enlarged cross-sectional view showing part of the apparatus of the second embodiment, which is near a conductive ring;

FIG. 10 is a graph showing a relationship between the diameter of the conductive ring and the etching speed of the wafer in an apparatus similar to the second embodiment and from which a permanent magnet is removed;

DETAILED DESCRIPTION OF THE PREFERRED EMBODIMENTS

Embodiments of the present invention will now be described when it is applied to a magnetron plasma etching apparatus.

Figure 1:
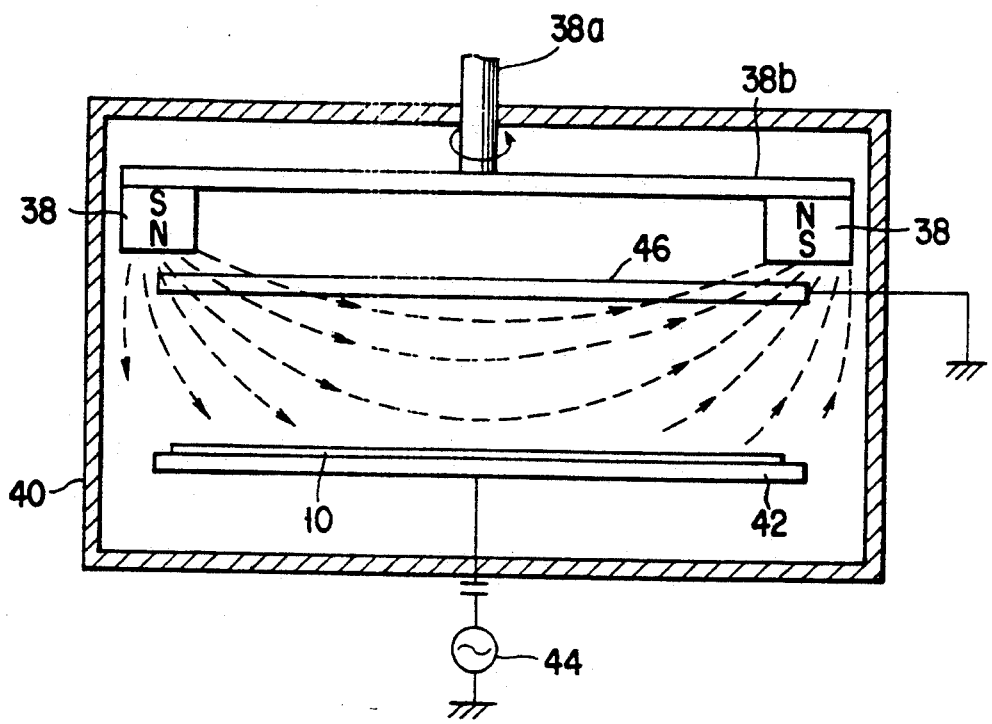
FIG. 1 is a cross-sectional view schematically showing a conventional magnetron plasma etching apparatus.
Figure 2:
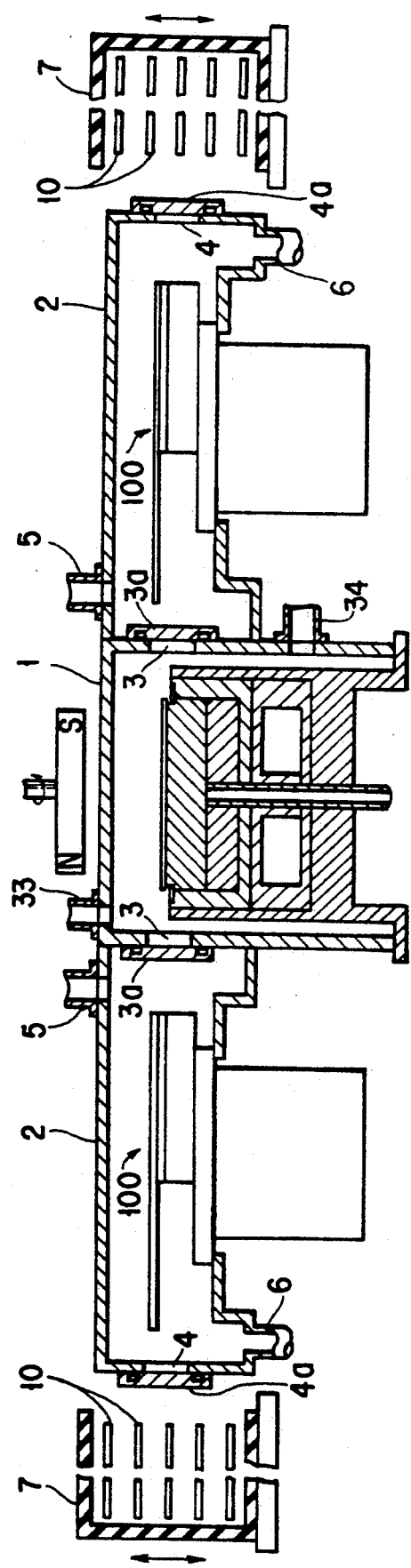
FIG. 2 is a cross-sectional view showing a magnetron plasma etching apparatus according to a first embodiment of the present invention and a wafer carrying system.

FIG. 2 is a cross-sectional view showing a magnetron plasma etching apparatus according to a first embodiment of the present invention and a wafer carrying system.

Load lock chambers 2 are connected to both sides of a process chamber 1. Each of the chambers 2 communicates with the chamber 1 through an opening 3. A gate 3a is arranged on the opening 3 so that it can be opened and closed. Each of the chambers 2 has another opening 4 formed on the opposite side of the opening 3. A gate 4a is arranged on the opening 4 so that it can be opened and closed. The opening 4 is opposite to a cassette 7 for storing wafers 10.

Since an air supply pipe 5 for supplying an inactive gas (e.g., nitrogen) and an exhaust pipe 6 connected to a vacuum pump, are connected to each of the load lock chambers 2, an inner atmosphere of the chamber 2 can be changed to a high reduced pressure atmosphere and an inactive gas atmosphere, independently of the process chamber 1. Each of the load lock chambers 2 includes a wafer carrying device 100 which will be described later. The wafer carrying device 100 carries the wafers 10 between the cassette 7 and the process chamber 1. With respect to the arrangement of the etching and load block chambers 1 and 2, the wafers 10 are normally loaded from one of the cassettes 7 into the process chamber 1, processed therein, and unloaded into the other cassette 7. According to another operation, one of the wafer carrying devices 100 can be used to load and unload the wafers 10.

Figure 3:
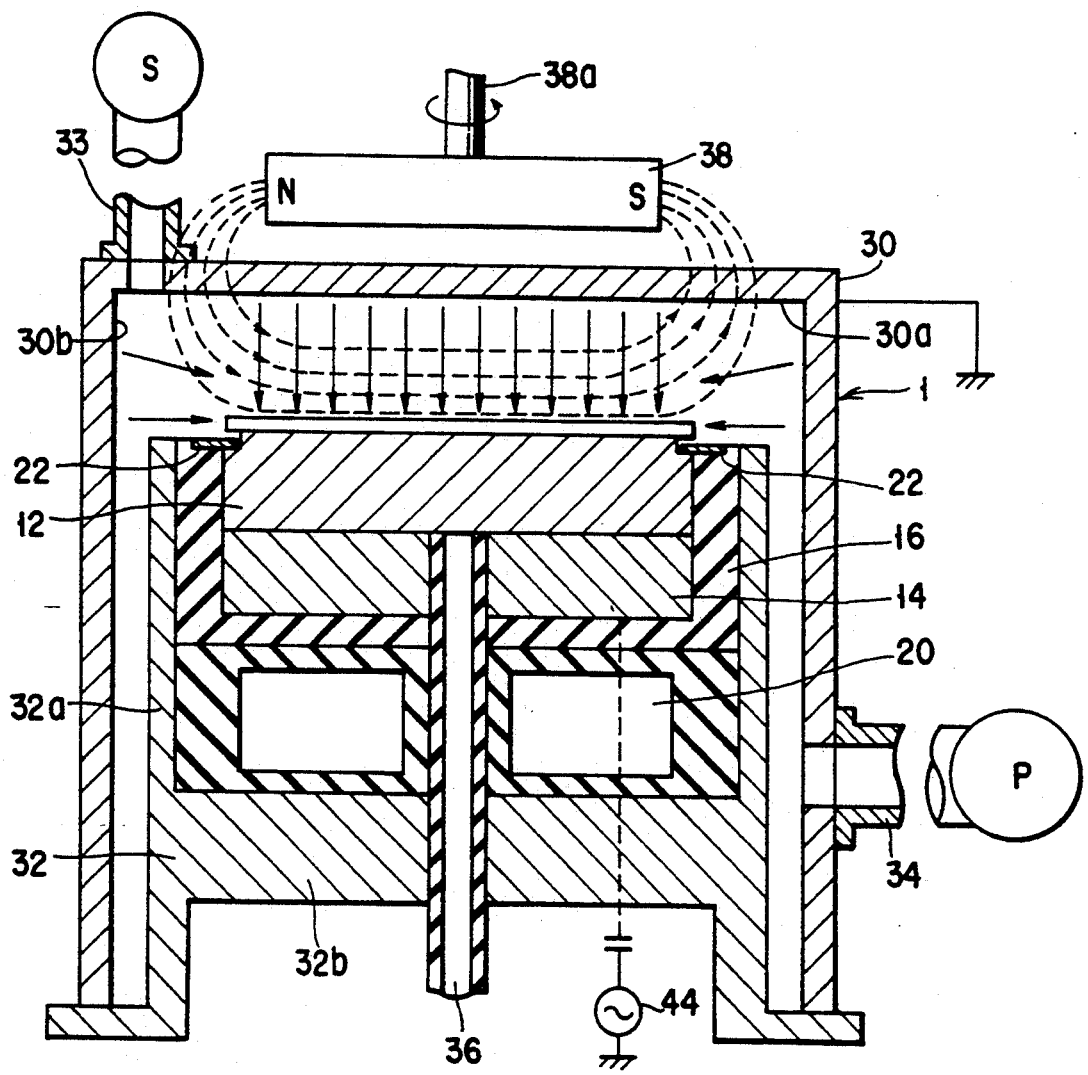
FIG. 3 is an enlarged sectional view showing a main part of the apparatus of the first embodiment.

FIG. 3 is an enlarged sectional view showing the main part of the apparatus of the first embodiment.

A wafer 10 as an object to be processed, is fixed on the upper surface of a first suscepter 12. For example, an electrostatic chuck (not shown) can be used to fix the wafer 10 on the suscepter by the coulomb attraction. The first suscepter 12 is detachably fixed on the upper surface of a second suscepter 14. These two suscepters are used to facilitate the maintenance of the apparatus since the upper first suscepter 1 has only to be exchanged when it is contaminated.

In the first embodiment, the diameter of the first suscepter 12 is 180 mm and is applied when the diameter of each of the wafers 10 is 150 mm.

The sides and undersurfaces of the first and second suscepters 12 and 14 are covered with a ceramic insulation member 16. A liquid nitrogen container 20 serving as a cooling section is provided under the insulation member 16. The bottom of the liquid nitrogen container 20 is formed in a porous state to allow nucleate boiling and to keep liquid nitrogen at −196° C.

The process chamber 1 for forming a reaction chamber includes an upper chamber portion 30 and a lower chamber portion 32.

The lower chamber portion 32 has a cylindrical portion with a bottom so that only the wafer mounting surface of the first suscepter 12 is exposed into the chamber, and the other area of the first suscepter 12 is covered. More specifically, the lower chamber portion 32 includes a side wall 32a covering the sides of the first suscepter 12, the second suscepter 14, the insulation member 16, and the liquid nitrogen container 20, and a support wall 32a supporting the side wall 32b.

The upper chamber portion 30 is formed like a cylinder to cover the surrounding of the side wall 32a of the lower chamber portion 32, and its lower end is connected and fixed to the lower chamber portion 32. The upper chamber portion 30 has a surface 30a opposite to the upper surface of the first suscepter 12. An etching gas such as $Cl_2$ is introduced from a source S through a pipe 33 connected to the upper chamber portion 30.

The reaction chamber 1 thus constituted by the upper and lower chamber portions 30 and 32 can be evacuated through a pipe 34 by means of a pump P.

As shown in FIG. 3, a through hole is formed in the second suscepter 14, insulation member 16, and liquid nitrogen container 20, and a pipe 36 is disposed in the through hole. An interstice is formed in a contact surface between the wafer 10 and the first suscepter 12 by slight irregularities of the back of the wafer and causes an uneven temperature on the wafer 10. However, the interstice is filled with a He gas of a predetermined pressure supplied from the pipe 36 through a pipe (not shown) arranged in the first suscepter 12, thereby preventing the uneven temperature on the wafer 10.

In the first embodiment, the upper chamber portion 30 is grounded, and an RF power supply 44 is connected to the first and second suscepters 12 and 14 to form two electrodes. In other words, the surface 30a of the upper chamber portion 30 functions as an anode electrode and the surface of the first suscepter 12 functions as a cathode electrode to constitute an RIE system magnetron plasma etching apparatus. The etching gas is then introduced into the evacuated chamber to generate plasma between the two electrodes. Since, in the first embodiment, the surface 30a of the upper chamber portion 30 is used as an anode electrode, the structure of the apparatus can be simplified, and a permanent magnet 38, which will be described later, can be arranged outside the upper chamber portion 30. Since the permanent magnet 38 is arranged outside the upper chamber portion 30, the capacity of the reaction room 1 can be decreased. Therefore, the load of the vacuum pump P connected to the pipe 34 can be reduced, or the time required for evacuating the reaction room 1 can be shortened.

In this embodiment, the anode electrode (upper chamber portion 30) has a portion (surface 30a) opposite to the cathode electrode (first suscepter 12) and another portion (surface 30b) perpendicular to the cathode electrode. Thus, an electric field of horizontal components is generated on the periphery of the wafer 10, as indicated by the solid lines in FIG. 3.

The permanent magnet 38 is rotated to generate a rotational magnetic field between the surface 30a of the upper chamber portion 30 and the first suscepter 12. The rotational magnetic field is generated, because an electric field generated between the upper chamber portion 30 and the first suscepter 12, and the components of the magnetic field perpendicular to the electric field act on the Fleming's rule to cause the cycloid movement of electrons occurs in directions perpendicular to the electric field and the components of the magnetic field, thereby to increase the frequency of a collision between the electrons and gas components.

The magnetic field generated by the permanent magnet 38 is virtually horizontal above the central part of the wafer 10, and gradually slants like an arc toward the periphery of the wafer, i.e., the vertical components of the magnetic field are increased. In contrast, the electric field generated by the anode and cathode electrodes includes almost vertical components in the central part of the wafer 10 and horizontal components on the periphery of the wafer 10, since there are two portions of the anode electrode parallel and perpendicular to the cathode electrode. For this reason, the cycloid movement of electrons caused by the magnetic field and electric field perpendicular to each other, is uniformed on the central part of the wafer 10 and on the periphery thereof. In other words, plasma is uniformly generated both on the central part of the wafer 10 and on the periphery thereof, and the wafers can be etched uniformly. This is the first advantage of the present invention.

A conductive ring 22 formed of a conductive member, e.g., carbon, is mounted on the upper surface of the lower chamber portion 32 along the circumference of the wafer 10. The ring 22 is fixed into a recess formed in the upper portion of the ceramic insulation member 16.

The conductive ring 22 electrically contacts the suscepter 12 and is insulated from the lower chamber portion 32. The ring 22 is formed of material whose electrical resistance is lower than that of an object to be processed. For example, nonmetallic SiC, carbon, and the like can be used for the silicon wafer 10. The conductive ring 22 attracts electrons floating in a plasma generation region above the ring 22 to uniform the density of the electrons on the periphery of the wafer 10. If the ion distribution is uniform on the periphery of the wafer 10, damage to the wafer is reduced. This is the second advantage of the present invention.

Since the outer diameter of the ring 22 is larger than the diameter of the first suscepter 12 and that of the wafer 10, substantially the same effect can be obtained as in the case of enlargement of the virtual area of the wafer 10. As described above, the ion density of etching gas (e.g., Cl) tends to increase on the periphery of the wafer 10. If, however, the virtual area of the wafer 10 is enlarged by the ring 22, an adverse influence on the periphery of the wafer 10 can be removed by the ring 22. In other words, if the plasma generation region extends over the conductive ring 22, a high Cl density region cannot be formed above the wafer 10 but the ring 22. This is the third advantage of the present invention.

FIGS. 6A and 6B are views showing modifications to the conductive ring 22 according to the first embodiment. FIG. 6A shows the ring 22 whose upper surface is flush with the major surface of the wafer 10, and FIG. 6B shows the ring 22 whose upper surface is higher than the major surface of the wafer 10.

Since the conductive ring 22 is detachably mounted, only the ring can be exchanged when it is contaminated. The maintenance of the apparatus can thus be simplified.

Experiment 1

The damage to the wafer 10 was evaluated by an $E^2PROM$ evaluation method in order to examine the effect of the conductive ring 22.

According to the $E^2PROM$ evaluation method, damage is caused to a wafer 10', on which an $E^2PROM$ is formed, in place of the original object to be processed (e.g., silicon wafer on which a resist is formed), and the threshold voltage of the damaged E²PROM is compared with that of the E²PROM which is not damaged, thereby evaluating the degree of the damage of the E²PROM. More specifically, when the E²PROM is damaged, the density of electrons in a floating gate increases, and threshold voltage $V_{Th}$ increases accordingly. The increased threshold voltage is compared with that of the E²PROM which is not damaged, thereby determining the degree of the damage of the E²PROM.

FIG. 4 is a top view conceptually showing the wafer 10' on which the E²PROM is formed, for explaining a method of evaluating the damage of the E²PROM using the E²PROM evaluation method.

The threshold voltage $V_{Th1}$ of E²PROM which was not damaged and the threshold voltage $V_{Th2}$ of E²PROM which was damaged, were measured in a plurality of positions on the line A - B shown in FIG. 4, and a difference $\Delta(=V_{Th2}-V_{Th1})$ between them were calculated, thereby evaluating the damage of the E²PROM.

The damage was evaluated when the permanent magnet 38 was not rotated and the North and South Poles were fixed at the positions shown in FIG. 4. In this case, a high electron density region was formed in a specific region above the periphery of the wafer 10', as shown in FIG. 4.

In the first embodiment, an insulating ring formed of quartz was used in place of the conductive ring 22, and the same damage evaluation was performed. FIG. 5 is a graph showing results of damage evaluation using the conductive and insulating rings. In FIG. 5, the abscissa indicates the positions (mm) on the line A - B of the wafer 10', while the ordinate indicates the difference $\Delta V_h(V)$.

As is apparent from FIG. 5, the difference $\Delta V_{Th}$ increased as the density of electrons in plasma became high, regardless of whether the conductive or insulating ring was used. However, the maximum difference $\Delta V_{Th}$ was nearly 8 V when the insulating ring was used, and it was about 2 V when the conductive ring was used.

In the magnetron etching apparatus according to the first embodiment, which uses the conductive ring 22, the difference $\Delta V_{Th}$ can be reduced more drastically than that in the case of the insulating ring. This phenomenon produces a great effect when etching of polysilicon is performed.

Figure 7:
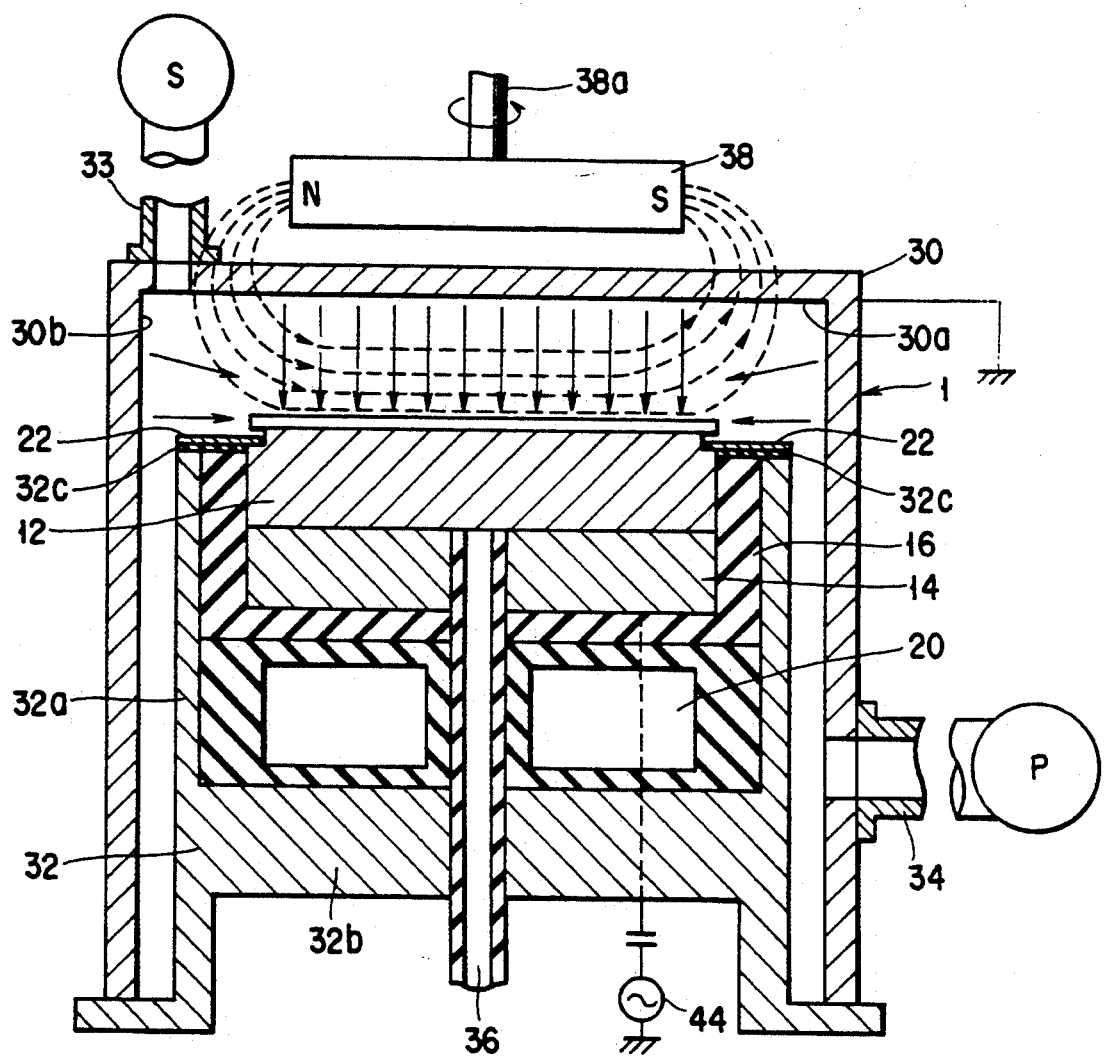
FIG. 7 is an enlarged cross-sectional view showing the main part of a magnetron plasma etching apparatus according to a second embodiment of the present invention.

FIG. 7 is an enlarged cross-sectional view showing the main part of the magnetron plasma etching apparatus according to a second embodiment of the present invention. In FIG. 7, the elements corresponding to those shown in FIG. 3 are denoted by the same reference numerals and their descriptions are omitted.

FIG. 8 shows an enlarged part of the apparatus shown in FIG. 7. As is apparent from FIG. 8, the second embodiment differs from the first embodiment in that the conductive ring 22 is arranged on an insulating ring 32C. The insulating ring 32C has an outer diameter which is substantially the same as that of the support wall 32b of the lower chamber portion 32 and an inner diameter which is substantially the same as that of the ceramic insulation member 16.

The conductive ring 22 electrically contacts the suscepter 12 and is insulated from the lower chamber portion, as in the first embodiment. The ring 22 is formed of material whose electrical resistance is lower than that of an object to be processed. For example, nonmetallic SiC, carbon, and the like can be used for the silicon wafer 10. The outer diameter of the ring 22 is larger than the diameter of the first suscepter 12 and that of the wafer 10. Consequently, the same advantage as that of the first embodiment can be obtained from the second embodiment.

Figure 11A:
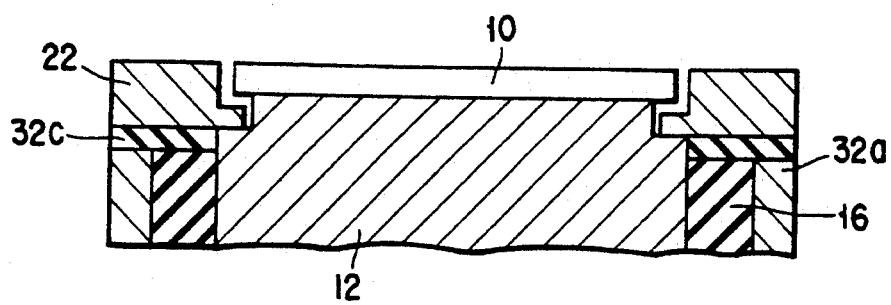
FIGS. 11A to 11D are cross-sectional views showing modifications to the conductive ring of the apparatus of the second embodiment.
Figure 11B:
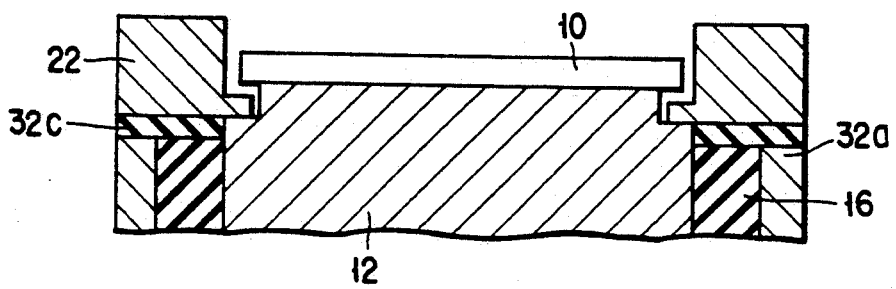
Figure 11C:
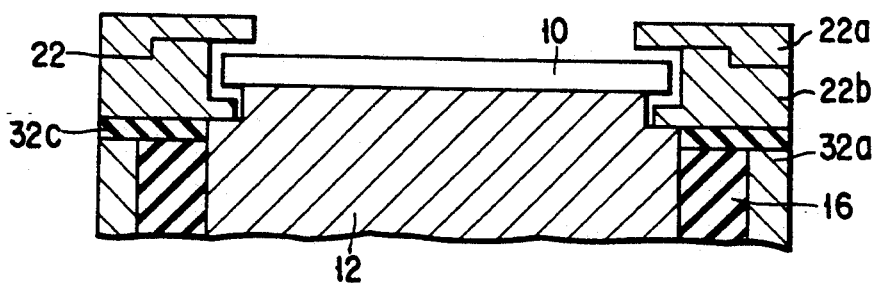
Figure 11D:
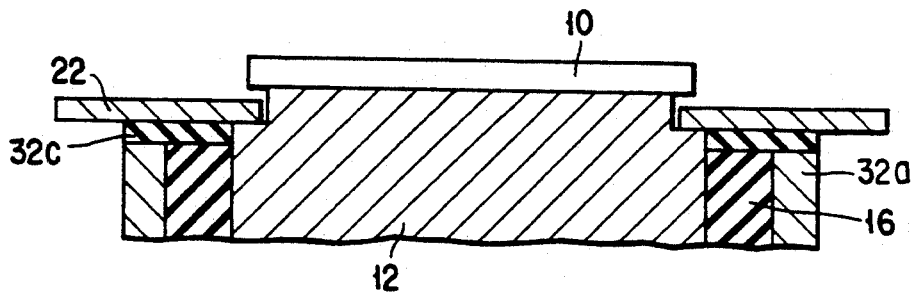
Figure 12:
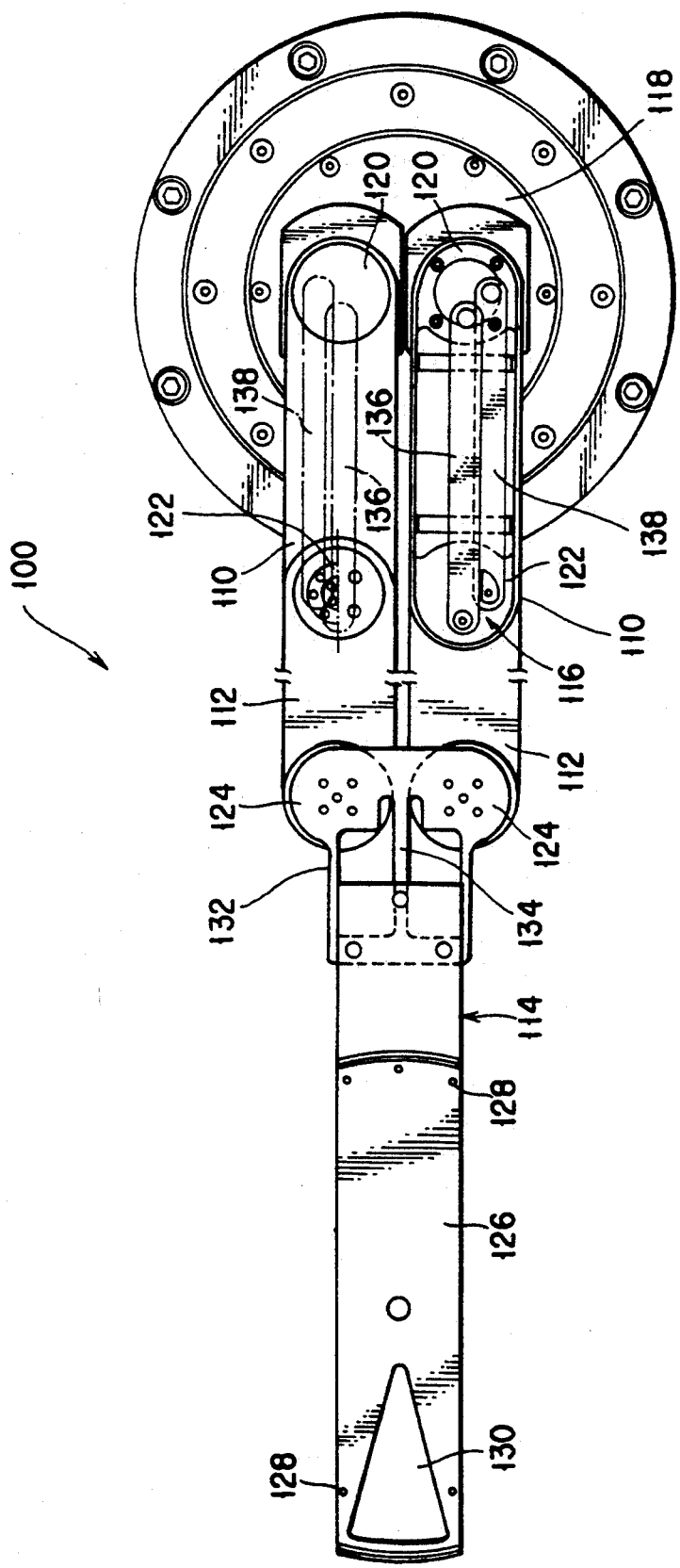
FIG. 12 is a plan view showing a constitution of the main part of the wafer carrying device.

FIGS. 11A to 11D are cross-sectional views showing modifications to the conductive ring 22 of the apparatus according to the second embodiment. In FIG. 11A, the upper surface of the ring 22 is flush with the major surface of the wafer 10. In FIG. 11B, the upper surface of the ring 22 is higher than the major surface of the wafer 10. In FIG. 11C, the ring 22 is constituted of upper and lower rings 22a and 22b which can be separated from each other, and the upper surface of the upper ring 22a is higher than the major surface of the wafer 10, and its inner diameter is smaller than the diameter of the wafer 10. In FIG. 11D, the thickness of the ring 22 is the same as and the outer diameter thereof is larger than that of the ring shown in FIGS. 7 and 8.

Since the conductive ring 22 is detachably mounted as in the first embodiment, only the ring can be exchanged when it is contaminated. The maintenance of the apparatus can thus be simplified.

Experiment 2

To inspect the relationship between the diameter of the conductive ring 22 and the etching speed of the wafer 10, the following experiment was carried out by using the apparatus according to the second embodiment and by changing only the outer diameter of the ring 22 as shown in FIG. 11D. In this experiment, the carbon ring 22 and silicon wafer 10 were used, and the etching speed and outer diameter were measured. Etching was performed on the measurement conditions shown in Table 1.

TABLE 1

| Etching conditions | |
|---|---|
| Pressure | 75 mTorr |
| Gas flow rate | 100 SCCM |
| Gas | $Cl_2$ |
| RF | 13.56 MHz |
| RF power | 0.39 W/cm² |
| Magnetic field | 120 gauss |

Figure 9:
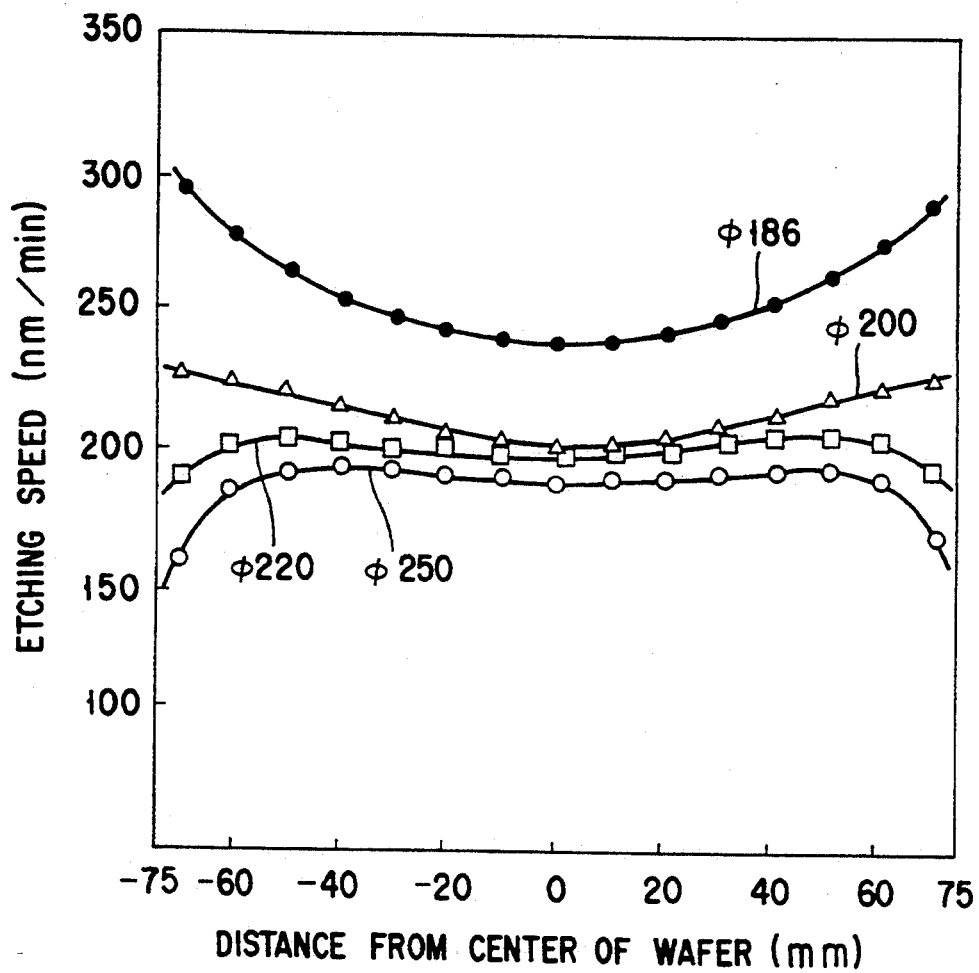
FIG. 9 is a graph showing a relationship between the diameter of the conductive ring and the etching speed of a wafer in the apparatus of the second embodiment.

FIG. 9 is a graph showing results of the measurement of experiment 2. In FIG. 9, the abscissa indicates the distance (mm) from the wafer 10, while the ordinate indicates the etching speed (nm/min).

When the ring 22 having an outer diameter of 186 mm (d=18 mm in FIG. 8) was used, the etching speed was low on the central part of the wafer 10 and high on the periphery thereof. The average etching speed on the entire etching surface of the wafer 10 was 256.7 nm/min, and the dispersion of the etching speed was ±10.7% when the average etching speed was a standard value.

When the ring 22 having an outer diameter of 200 mm (d=25 mm in FIG. 8) was used, the average etching speed was 211.2 nm/min, and the dispersion of the etching speed was ±6.4% when the average etching speed was a standard value. When the latter ring 22 was used, whose diameter was 14 mm larger than that of the former ring 22 whose outer diameter was 186 mm, the dispersion of the etching speed was reduced drastically.

When the ring 22 having an outer diameter of 220 mm (d=35 mm in FIG. 8) was used, the average etching speed was 198.7 nm/min, and the dispersion of the etching speed was ±6.8% when the average etching speed was a standard value. The dispersion of the etching speed was reduced to substantially the same extent as in the case of the ring whose outer diameter was 200 mm.

When the ring 22 having an outer diameter of 250 mm (d=50 mm in FIG. 8) was used, the average etching speed was 185.3 nm/min, and the dispersion of the etching speed was ±15.3% when the average etching speed was a standard value. In this case, the etching speed was high on the central part of the wafer 10 and low on the periphery thereof, contrary to the case of the carbon ring of a standard size, with the result that the dispersion of the etching speed was increased.

If the carbon ring 22 having a large diameter was used, the etching speed of the silicon wafer 10 was uniformed. When however, the diameter of the ring 22 was too large, the etching speed decreased too much on the periphery of the wafer, and the uniformity of the etching speed deteriorated after all. Furthermore, the average of the etching speed tended to decrease as the diameter of the carbon ring 22 became larger.

It is desirable that the dispersion of the etching speed be ±10% or less, and it is more desirable that it be ±7% or less. To set the dispersion of the etching speed at ±7% or less, the conductive ring 22 has only to have an outer diameter of 130 to 150% of the diameter of the wafer 10.

Experiment 3

In order to examine the effect of the conductive ring 22 in a magnetron-free plasma etching apparatus, the permanent magnet 38 was removed from the apparatus according to the second embodiment shown in FIG. 7, and the same measurement as above was executed. In the experiment 3, the carbon ring 22 and silicon wafer 10 were used, and etching and measurement conditions were the same as those in the experiment 2.

FIG. 10 is a graph showing results of the measurement of experiment 3. In FIG. 10, the abscissa indicates the distance (mm) from the wafer 10, while the ordinate indicates the etching speed (nm/min).

When the ring 22 having an outer diameter of 186 mm (d=18 mm) was used, the etching speed was low on the central part of the wafer 10 and high on the periphery thereof. The average etching speed on the entire etching surface of the wafer 10 was 175.8 nm/min, and the dispersion of the etching speed was ±35.1% when the average etching speed was a standard value.

When the ring 22 having an outer diameter of 200 mm (d=25 mm) was used, the average etching speed was 133.6 nm/min, and the dispersion of the etching speed was ±32.6% when the average etching speed was a standard value. When the latter ring 22 was used, whose diameter was 14 mm larger than that of the former ring 22 whose outer diameter was 186 mm, the dispersion of the etching speed was reduced.

When the ring 22 having an outer diameter of 220 mm (d=35 mm) was used, the average etching speed was 108.0 nm/min, and the dispersion of the etching speed was ±27.0% when the average etching speed was a standard value. The dispersion of the etching speed was reduced to a greater extent than in the case of the ring whose outer diameter was 200 mm.

When the ring 22 having an outer diameter of 250 mm (d=50 mm) was used, the average etching speed was 84.4 nm/min, and the dispersion of the etching speed was ±11.2% when the average etching speed was a standard value. In this case, the dispersion of the etching speed was reduced drastically.

It was thus confirmed that the etching speed of the silicon wafer 10 could be uniformed by using the carbon ring having a large diameter in the magnetron-free plasma etching apparatus. However, in the magnetron-free plasma etching apparatus, the dispersion of the etching speed was generally greater than and the average etching speed was lower than in the case of the magnetron plasma etching apparatus.

As described above, the dispersion of the etching speed was reduced extremely by using the carbon ring 22 having a large diameter. As is apparent from FIGS. 9 and 10, when a rotational magnetic field was formed in the plasma generation region using the permanent magnet 38, the average etching speed was increased more than and the dispersion of the etching speed was decreased more than when the permanent magnet was not used.

The present invention is not limited to the above embodiments. Various changes and modifications can be made within the scope of the subject matter of the invention.

For example, in the first and second embodiments, the surface 30a of the upper chamber portion 30 serves as an anode electrode, and the permanent magnet 38 is arranged outside the upper chamber portion 30. However, an anode electrode and a magnetic field generator can be formed in the reaction room.

The conductive ring 22 is formed of carbon in the above embodiments, but can be formed of other conductive material such as SiC and Al. Since, however, the conductive ring 22 is formed to prevent electrons from being injected from plasma into the wafer 10, it is desirable that the electrical resistance of the ring 22 be lower than that of the wafer 10. The conductive ring 22 can be changed to another one having an electrical resistance suitable for that of the wafer 10.

Further, only the surface of the ring 22 can be formed of the conductive material. In other words, a ring formed of insulating material on the surface of which a conductive film is formed, can be used as a conductive ring. In the present invention, such a ring is also referred to as a conductive ring. In this case, however, the surface of the ring has to electrically contact a suscepter 14.

A wafer formed of polysilicon, monocrystalline silicon, amorphous silicon, or the like can be used as a substrate or an object to be processed. Further, a liquid crystal substrate can also be used as an object to be processed in an etching apparatus.

The present invention is not always applied to the magnetron plasma etching apparatus but can be applied to another magnetron plasma processing apparatus such as a plasma CVD apparatus.

The wafer carrying device 100 arranged in the load lock chamber 2 (shown in FIG. 2) will be described with reference to FIGS. 12 to 17.

The wafer carrying device 100 employs a frog-leg carrying arm including a pair of first arms 110, a pair of second arms 112, a top arm 114 serving as a support member for an object to be carried, and cranks 116.

The first arms 110 are each attached to two first support shafts 120 spaced from each other on a base 118 which can be rotated with respect to a housing 182 fixed onto a base plate 180. The first arms 110 are rotated on the first support shafts 120, respectively. Second support shafts 122 are attached to the end portions of the first arms 110, respectively. The load lock chamber 2 is occupied with a vacuum atmosphere above the base plate 180 and is opened to air under the base plate 180.

The second arms 112 are each attached to the second support shafts 122 attached to the end portions of the first arms 110. The second arms 112 are rotated on the second support shafts 122, respectively.

The top arm 114 is provided with two third support shafts 124, and the end portions of the second arms 112 are attached to the third support shafts 124, respectively, so that they can be rotated. A mounting portion 126 on which a semiconductor wafer is mounted, is attached to a free end of the top arm 114. A plurality of small projections 128 for supporting the semiconductor wafer are formed on the upper surface of the mounting portion 126. Since the semiconductor wafer is supported by the small projections, an area for contact of the semiconductor wafer and the mounting portion can be reduced, thereby preventing dust from adhering to the wafer. Since an arm portion of the carrying device 100 is formed as a cantilever, a triangular lightening hole 130, for example, is formed in the mounting portion 126 to lighten the arm portion. The top arm 114 can be linearly moved from one end of the base 118 to the other end of the base 118 through a position where the first and second arms 110 and 112 overlap each other. If the lengths of the first and second arms 110 and 112 are the same when the top arm 114 moves above these arms 110 and 112 overlapping each other, the top arm 114 is stopped by load applied thereto. A slit 134 is formed between the third support shafts 124 of an arm holder 132 and along the longitudinal direction of the third support shafts, so that the arm holder 132 is bent by the slit 134, in order to prevent the top arm 114 from being stopped.

Figure 13:
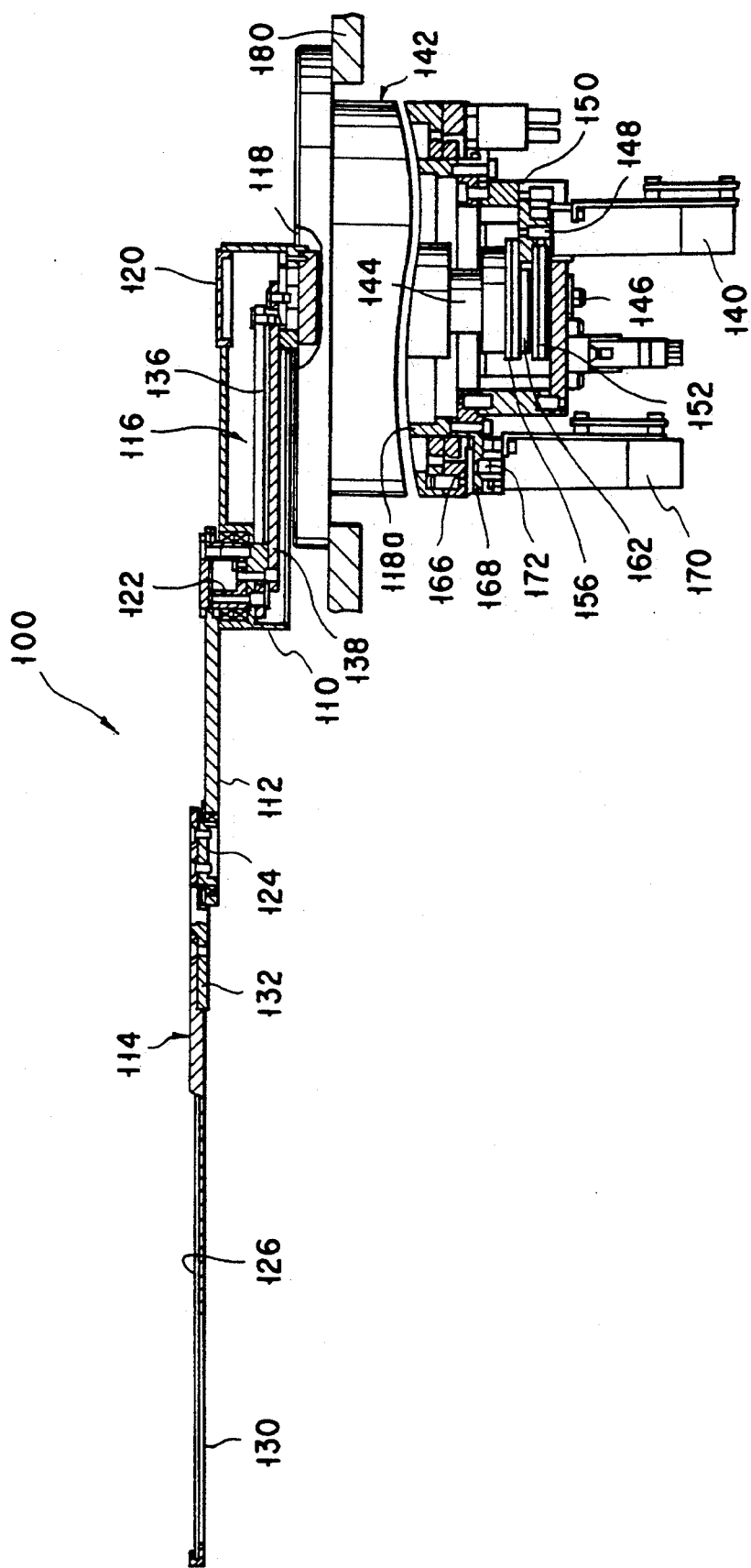
FIG. 13 is a vertical longitudinal sectional view of the wafer carrying device.
Figure 14:
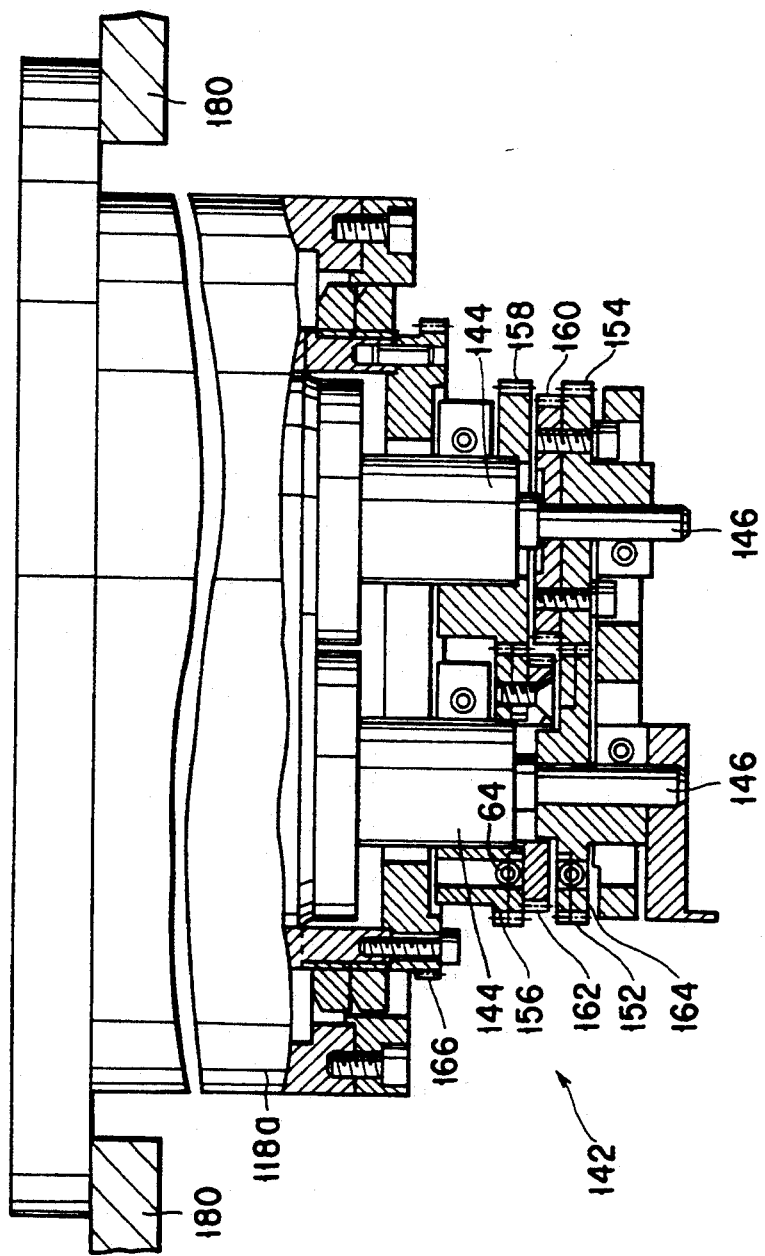
FIG. 14 is an enlarged cross-sectional view of a drive mechanism of the wafer carrying device.

As shown in FIG. 13, each of the cranks 116 is arranged between the first and second support shafts 120 and 122 to rotate the second support shafts 122 in association with the first support shafts 120. The cranks 116 are each constituted by a pair of parallel crank arms 136 and 138.

A drive mechanism of the first support shafts 120 and the cranks 116 will now be described with reference to FIGS. 13 to 17. The drive mechanism transmits a driving force from a motor 140 serving as a driving source to the first support shafts 120 and cranks 116 through a driving force transmitter 142. More specifically, the first support shafts 120 are mounted on cyrindrical outer shafts 144, respectively, and the crank arms 136 and 138 are mounted at their ends on middle shafts 146 penetrating the outer shafts 144. The outer and middle shafts 144 and 146 are thus coupled to the driving force transmitter 142. The outer shafts 144 are rotatably supported by upper and lower bearings 184, and the middle shafts 146 are rotatably supported by upper and lower bearings 186. The outer shafts 144 are surrounded by a case 188.

The driving force transmitter 142 includes a gear attached to an output shaft 148 of the motor 140, gears 152 and 154 attached to the middle shaft 146 near the crank 116, and gears 156 and 158 attached to the outer shaft 144 near the first support shafts 120. Intermediate gears 160 and 162 are integrally formed with the upper surface of the gear 154 and with the lower surface of the gear 156, respectively. The gears 152 and 154 of the middle shafts 146 are engaged with each other, and the gears 156 and 158 of the outer shafts 144 are engaged with each other. Further, the gear 150 of the output shaft 148 is engaged with the intermediate gear 160 of the middle shaft 146 and the intermediate gear 162 of the outer shaft 144.

Figure 15:
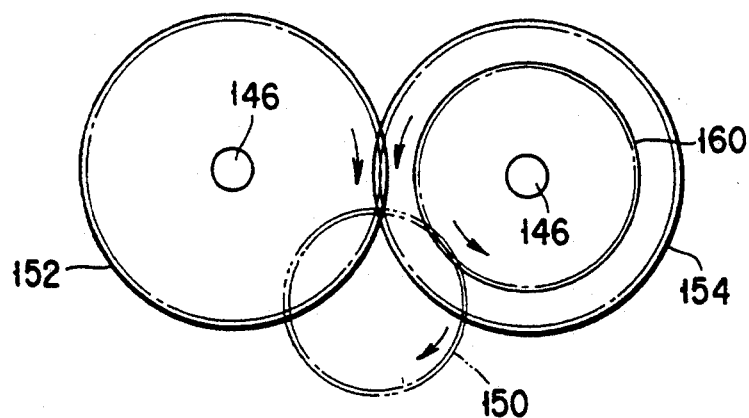
FIG. 15 is a view showing a relationship between an inner drive shaft and its gear of the wafer carrying device.
Figure 16:
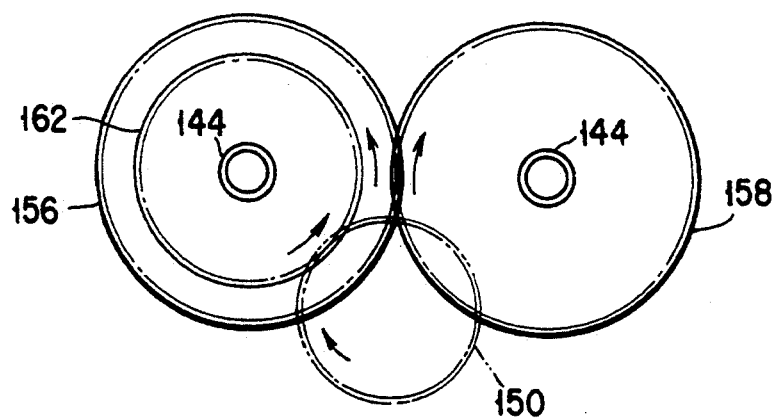
FIG. 16 is a view showing a relationship between an outer drive shaft and its gear of the wafer carrying device.
Figure 17:
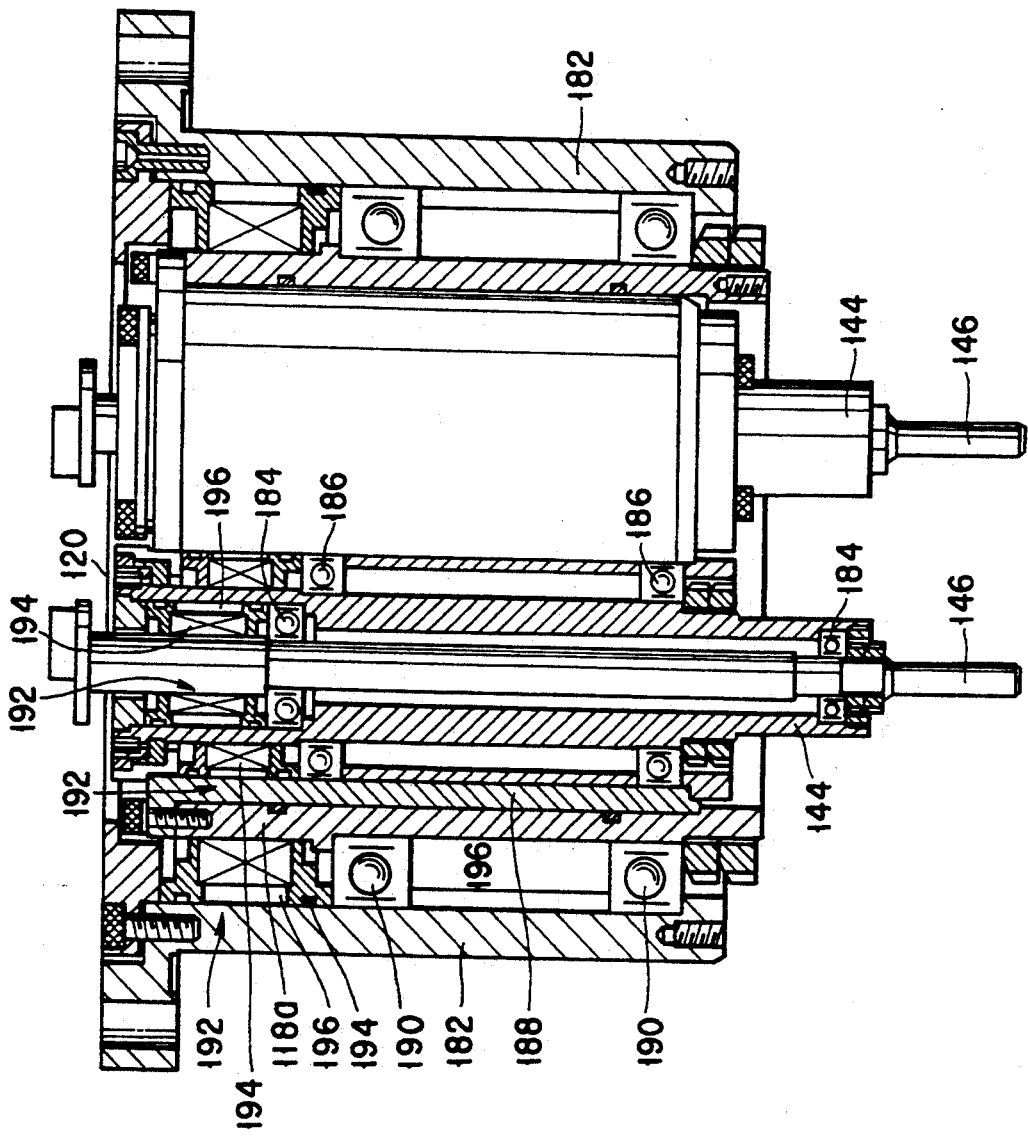
FIG. 17 is a cross-sectional view showing a magnetic fluid seal of a rotating drive unit of the wafer carrying device.

If the single motor 140 is rotated clockwise, on the first support shaft side, as shown in FIG. 16, the rotating force is transmitted in sequence to the gear 150 of the output shaft 148, the intermediate gear 162 of the left outer shaft 144, the gear 156 of the left outer shaft 144, and the gear 158 of the right outer shaft 144 in this order. The left outer shaft 144 is rotated counterclockwise, while the right outer shaft 144 is rotated clockwise, thereby opening the first arms 110. On the crank side, as shown in FIG. 15, the rotating force is transmitted to the gear 150 of the output shaft 148, the intermediate gear 160 of the right middle shaft 146, the gear 154 of the right middle shaft 146, and the gear 152 of the left middle shaft 146 in this order. The left middle shaft 146 is rotated clockwise, and the right middle shaft 146 is rotated counterclockwise. Thus, the second support shafts 122 are rotated inwardly by the parallel crank arms, and the second arms 112 are rotated inwardly.

The gears 152 and 156 are each formed by putting two gears one on the other, and a spring 164 for pulling the gears 152 and 156 by force greater than torque applied to the gears 152 and 156, is interposed between these gears to eliminate a back rush of the gears. It is desirable to attach the spring to the final gear in which the back rushes of the gears are accumulated.

Furthermore, a ring-shaped gear 166 is attached to a rotating shaft 118a of the base 118 on which the first arms are mounted, and a gear 168 engaged with the gear 166 is integrally formed with an output shaft 172 of a motor for rotating the base. The base 118 is horizontally rotated by rotation of the motor 170 to change the direction of the top arm 114. The base 118 is rotatably supported by upper and lower bearings 190 arranged between the base 118 and the housing 182.

A magnetic fluid seal 192 is attached to the two outer shafts 144, two middle shafts 146, and the rotating shaft 118a of the base 118. The magnetic fluid seal 192 is constituted by a magnet 194 attached to each of the shafts, and a magnetic fluid 196 for sealing between each of the shafts and outer shafts 144, case 188, or the housing 182. The magnetic fluid seal 192 is arranged higher than the upper bearings 184, 186, and 190 for supporting the outer shafts 144, middle shafts 146, and rotating shaft 118 to seal the housing 182 in a vacuum manner.

An operation of the wafer carrying device 100 will now be described.

In the wafer carrying device arranged in the load lock chamber 2, the carrying arm extends to a sender and, if the motor 140 is rotated when a semiconductor wafer is mounted on the mounting portion 126 of the top arm 114, the outer shafts 144 are rotated outwardly by means of the gears 150, 162, 156, and 158. The end portions of the first arms 110 are rotated outwardly on the first support shafts 120.

As the first arms 110 are rotated, the middle shafts 146 are rotated inwardly by means of the gears 150, 160, 154, and 152, the parallel crank arms 136 and 138 coupled to the middle shaft 146 rotate the support shafts 122 inwardly, and the end portions of the second arms 112 are rotated inwardly. Thus, the top arm 114 supported at the end of the second arm by the third support shafts 124, retreats linearly. Since the cranks 116 have a mechanical coupling structure, dust is not generated by friction or the like, with the result that semiconductor wafers can be carried without influence of dust. Furthermore, a reliable operation of the device can be achieved without transmission loss of the driving force. Since the driving force is generated by the motor 140 serving as a single driving source, energy can be saved, and the driving force is transmitted from the motor 140 to four driven sections by means of the outer and middle shafts 144 and 146 coaxially connected to the first support shafts 120. Therefore, the wafer carrying device can be compacted.

When the motor 140 continues to rotate, the first and second arms 110 and 112 overlap each other, and the top arm 114 goes over the overlapping arms and then retreats linearly. When the top arm 114 goes over the overlapping arms, the arm holder 134 of the top arm is bent by the slit formed in the arm holder 132 to absorb the load applied when the arms overlap. Therefore, the device is operated smoothly.

If the motor 170 is rotated when the top arm 114 retreats the most, the base 118 is horizontally rotated by means of the gear 168 attached to the output shaft 172 of the motor 170 and the gear 166 arranged near the base 118, thereby to change the direction of the carrying arm. When the arm is rotated until an entrance of the process chamber and then the motor 140 is rotated reversely of the above, the first and second arms 110 and 112 extend, and the top arm 114 enters the process chamber to carry the semiconductor wafer.

During the operation of the wafer carrying device, the load lock chamber has to be sealed in a vacuum manner while a vacuum state expands above the base plate 180 and an atmospheric state expands below the vacuum. Since five shafts of the two outer shafts 144, two middle shafts 146, and rotating shaft 118a of the base 118 are shielded by the magnetic fluid seal 192, the vacuum seal can reliably be achieved. Further, since the magnetic fluid 196 of the magnetic fluid seal 192 simply contacts fixed portions, torque loss of the rotating force is not caused, and a satisfactory operation can be performed. Though the diameter of the rotating shaft 118a for rotating the base 118 is considerably large, the mechanical contact resistance of the magnetic fluid seal 192 is not higher than that of a conventional 0-ring seal, so that the lifetime of the seal can be lengthened, irrespective of a large diameter of the seal. According to the experiment, the motor 170 for driving the rotating shaft 118a could be replaced with a motor whose torque was 1/10 of that of a conventional motor. Since the outer shafts 144 and 146 are coaxially attached to the first support shafts 120, as described above, the structure of the wafer carrying device is simple in forming the magnetic fluid seal.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A magnetron plasma etching apparatus comprising:
    a process chamber capable of being set at a highly reduced pressure atmosphere;
    introduction means for introducing etching gas into the process chamber;
    exhaust means for exhausting the process chamber;
    a first electrode exposed in the process chamber and having a mounting surface on which a substrate to be processed is mounted and a shoulder portion surrounding and situated at a lower level than the mounting surface, said mounting surface having an outline smaller than that of the substrate such that a gap is formed between the substrate and the shoulder portion when the substrate is mounted on the mounting surface;
    a second electrode exposed in the process chamber and having a major surface opposite to the mounting surface of the first electrode;
    power supply means for applying an RF voltage to the first and second electrodes to generate an electric field therebetween;
    magnetic generation means for generating a magnetic field between the first and second electrodes so as to cross the electric field substantially at right angles; and
    an electrically conductive ring formed independently of the first electrode so as to have an outline larger than that of the substrate and an opening smaller than the outline of the substrate and larger than the outline of the mounting surface, said conductive ring being detachably placed on the shoulder portion of the first electrode so as to extend into the gap formed between the substrate and the shoulder portion and to be electrically connected to the first electrode through the shoulder portion.

2. The apparatus according to claim 1, wherein at least part of a housing defining said process chamber is formed of an electrically conductive member, and said second electrode is formed of the conductive member.

3. The apparatus according to claim 2, wherein said magnetic field generation means comprises a permanent magnet arrange behind the conductive member and can be rotated about an axis perpendicular to the mounting surface of said first electrode.

4. The apparatus according to claim 1, wherein said conductive ring has an electrical resistance lower than that of the substrate.

5. The apparatus according to claim 4, wherein said conductive ring is formed of carbon or SiC and the substrate is a silicon wafer.

6. The apparatus according to claim 1, further comprising an electrically insulating frame arranged in the process chamber so as to house the first electrode, wherein said insulating frame has an end portion adjacent to the shoulder of the first electrode, and said conductive ring is detachably placed so as to extend from the shoulder portion onto the end portion of the insulating frame.

7. The apparatus according to claim 6, wherein a recess is formed on the end portion of the insulating frame, and said conductive ring is arranged so as to extend from the shoulder portion into the recess.

8. The apparatus according to claim 7, further comprising an electrically conductive frame arranged in the process chamber so as to house the insulating frame, wherein said conductive frame has a potential substantially the same as that of the second electrode.

9. The apparatus according to claim 6, further comprising an electrically conductive frame arranged in the process chamber so as to house the insulating frame, wherein said conductive frame has a potential substantially the same as that of the second electrode and an end portion adjacent to the end portion of the insulating frame.

10. The apparatus according to claim 9, further comprising an electrically insulating ring arranged on the ends of the insulating frame and the conductive frame, wherein said conductive ring is arranged so as to extend from the shoulder portion onto the insulating ring.

11. The apparatus according to claim 1, wherein said conductive ring comprises a raised portion having an opening larger than the outline of the substrate and surrounding the substrate.

12. The apparatus according to claim 11, wherein said raised portion has an upper surface aligned with that of the substrate mounted on the mounting surface.

13. The apparatus according to claim 11, wherein said raised portion has an upper surface situated at a higher level than an upper surface of the substrate mounted on the mounting surface.

14. A magnetron plasma etching apparatus comprising:
 a process chamber capable of being set at a highly reduced pressure atmosphere;
 introduction means for introducing etching gas into the process chamber;
 exhaust means for exhausting the process chamber;
 a first electrode exposed in the process chamber and having a mounting surface on which a substrate to be processed is mounted and a shoulder portion surrounding and situated at a lower level than the mounting surface, said mounting surface having an outline smaller than that of the substrate such that a gap is formed between the substrate and the shoulder portion when the substrate is mounted on the mounting surface;
 a second electrode exposed in the process chamber and having a major surface opposite to the mounting surface of the first electrode;
 power supply means for applying an RF voltage to the first and second electrodes to generate an electric field therebetween;
 magnetic generation means for generating a magnetic field between the first and second electrodes so as to cross the electric field substantially at right angles;
 an electrically insulating frame arranged in the process chamber so as to house the first electrode, and having an end portion adjacent to the shoulder of the first electrode;
 an electrically conductive frame arranged in the process chamber so as to house the insulating frame, and having a potential substantially the same as that of the second electrode; and
 an electrically conductive ring formed independent of the first electrode so as to have an outline larger than that of the substrate and an opening smaller than the outline of the substrate and larger than the outline of the mounting surface, said conductive ring being detachably placed on the shoulder portion of the first electrode and the end portion of the insulating frame so as to extend into the gap formed between the substrate and the shoulder portion and to be electrically connected to the first electrode through the shoulder portion.

15. The apparatus according to claim 14, wherein said conductive ring comprises a raised portion having an opening larger than the outline of the substrate and surrounding the substrate.

16. The apparatus according to claim 15, wherein said raised portion has an upper surface aligned with that of the substrate mounted on the mounting surface.

17. The apparatus according to claim 15, wherein said raised portion has an upper surface situated at a higher level than an upper surface of the substrate mounted on the mounting surface.

18. The apparatus according to claim 14, wherein said conductive ring has an electrical resistance lower than that of the substrate.

19. The apparatus according to claim 18, wherein said conductive ring is formed of carbon or SiC and the substrate is a silicon wafer.

* * * * *